US009614495B2

(12) United States Patent
Hamaoka et al.

(10) Patent No.: US 9,614,495 B2
(45) Date of Patent: Apr. 4, 2017

(54) ELASTIC WAVE ELEMENT WITH A REINFORCEMENT ELECTRODE AND LADDER FILTER USING SAME

(71) Applicant: SKYWORKS FILTER SOLUTIONS JAPAN CO., LTD., Kadoma-Shi (JP)

(72) Inventors: Yosuke Hamaoka, Osaka-Fu (JP); Mitsunori Miyanari, Osaka-Fu (JP); Hiroyuki Nakamura, Osaka-Fu (JP); Hidekazu Nakanishi, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 14/624,993

(22) Filed: Feb. 18, 2015

(65) Prior Publication Data

US 2015/0236238 A1 Aug. 20, 2015

Related U.S. Application Data

(63) Continuation of application No. PCT/JP2015/000718, filed on Feb. 17, 2015.

(30) Foreign Application Priority Data

Feb. 18, 2014 (JP) ................................ 2014-028059

(51) Int. Cl.
*H03H 9/64* (2006.01)
*H03H 9/02* (2006.01)
(Continued)

(52) U.S. Cl.
CPC ....... *H03H 9/6483* (2013.01); *H01L 41/0472* (2013.01); *H01L 41/107* (2013.01);
(Continued)

(58) Field of Classification Search
CPC ........... H03H 9/02944; H03H 9/02992; H03H 9/605; H03H 9/6463; H03H 9/6483; H01L 41/0472; H01L 41/107
(Continued)

(56) References Cited

U.S. PATENT DOCUMENTS 7,102,461 B2 * 9/2006 Nakano .................... H03H 3/08 29/25.35
8,334,737 B2 * 12/2012 Yamaji ............... H03H 9/02937 310/344
(Continued)

FOREIGN PATENT DOCUMENTS

EP 0702379 A1 3/1996
EP 1274167 A2 1/2003
(Continued)

OTHER PUBLICATIONS

International Search Report and Written Opinion from corresponding International Patent Application Serial No. PCT/JP2015/000718, dated Jul. 29, 2015, 22 pages.*

*Primary Examiner* — Barbara Summons
(74) *Attorney, Agent, or Firm* — Lando & Anastasi, LLP

(57) ABSTRACT

Methods and apparatus for reducing electric loss in an elastic wave element. In one example, the elastic wave element includes a piezoelectric body having a upper surface, an interdigital transducer (IDT) electrode disposed on the piezoelectric body, a connection wiring disposed on the piezoelectric body and electrically connected to the IDT electrode, the connection wiring having a lower connection wiring and an upper connection wiring provided above the lower connection wiring, and a reinforcement electrode provided above the connection wiring, the reinforcement electrode being in contact with and electrically connected to the lower connection wiring.

20 Claims, 10 Drawing Sheets

13 10 20 13 50 60 11 30 40 12 21 22 A AA 10 70 20

(51) Int. Cl.
*H01L 41/047* (2006.01)
*H01L 41/107* (2006.01)
*H03H 9/60* (2006.01)

(52) U.S. Cl.
CPC .... *H03H 9/02944* (2013.01); *H03H 9/02992* (2013.01); *H03H 9/6463* (2013.01); *H03H 9/605* (2013.01)

(58) Field of Classification Search
USPC .................. 333/193–196; 310/313 R, 313 B
See application file for complete search history.

(56) References Cited

U.S. PATENT DOCUMENTS

| | | | | |
|---|---|---|---|---|
| 2002/0121841 | A1 | 9/2002 | Shimoe et al. | |
| 2010/0117483 | A1* | 5/2010 | Tanaka | H03H 3/08 310/313 B |
| 2010/0148890 | A1 | 6/2010 | Inoue et al. | |
| 2012/0279795 | A1* | 11/2012 | Furukawa | H03H 9/02937 181/139 |
| 2013/0234558 | A1 | 9/2013 | Tsuda | |

FOREIGN PATENT DOCUMENTS

| | | | | |
|---|---|---|---|---|
| EP | 2175556 | A1 | | 4/2010 |
| JP | 10-022767 | A | * | 1/1998 |
| JP | 2008-235979 | A | * | 10/2008 |
| JP | 2011071912 | A | | 4/2011 |

* cited by examiner

ELASTIC WAVE ELEMENT WITH A REINFORCEMENT ELECTRODE AND LADDER FILTER USING SAME

CROSS-REFERENCE TO RELATED APPLICATIONS

The present application claims the benefit under 35 U.S.C. §119 and PCT Article 8 of co-pending Japanese Patent Application No. 2014-028059 filed on Feb. 18, 2014 and titled "ELASTIC WAVE ELEMENTS AND LADDER FILTERS USING SAME," which is hereby incorporated herein by reference in its entirety for all purposes. This application also claims the benefit under 35 U.S.C. §120 of co-pending International Application No. PCT/JP2015/000718 filed on Feb. 17, 2015 and titled "ELASTIC WAVE ELEMENTS AND LADDER FILTERS USING SAME," which is hereby incorporated herein by reference in its entirety for all purposes.

BACKGROUND

FIGS. 1 and 2 illustrate an example of a conventional elastic wave element 6000, which may be used in an electronic device such as a wireless communication apparatus. FIG. 1 shows a plan view of the conventional elastic wave element 6000, and FIG. 2 shows a corresponding cross-sectional view taken along line B-BB of FIG. 1. As shown in FIGS. 1 and 2, the conventional elastic wave element 6000 includes a first interdigital transducer (IDT) electrode 1000 and a second IDT electrode 2000 both provided on the upper surface of a piezoelectric body 5000. The conventional elastic wave element 6000 further includes a connection wiring 3000 connecting the first IDT electrode 1000 to the second IDT electrode 2000, and a reinforcement electrode 4000 provided on the connection wiring 3000. The reinforcement electrode 4000 is provided for reducing the electric resistance of the connection wiring 3000 connecting the first IDT electrode 1000 to the second IDT electrode 2000. In addition, the connection wiring 3000 includes a lower connection wiring 3002 and an upper connection wiring 3001. The upper connection wiring 3001 is provided on the upper surface of the lower connection wiring 3002.

Japanese Patent Application Publication No. 2011-71912 describes an example of such a conventional elastic wave element.

SUMMARY OF INVENTION

Aspects and embodiments are directed to an elastic wave element and a ladder filter using the same.

In conventional elastic wave elements, such as that discussed above with reference to FIGS. 1 and 2, merely providing the reinforcement electrode on the upper surface of the connection wiring is insufficient to adequately reduce the electric loss. Accordingly, embodiments of an elastic wave element according to the present invention may be configured to greatly reduce the electric loss in the connection wiring electrically connected between the IDT electrodes, as discussed in more detail below.

According to one embodiment, an elastic wave element comprises a piezoelectric body having an upper surface, an interdigital transducer (IDT) electrode provided above the piezoelectric body, a connection wiring connected to the IDT electrode provided above the piezoelectric body, the connection wiring having a lower connection wiring and an upper connection wiring provided above the lower connection wiring, and a reinforcement electrode provided above the connection wiring, the reinforcement electrode being in contact with and electrically connected to the lower connection wiring.

In one example of the elastic wave element, the connection wiring includes a hole electrode extending in a direction perpendicular to the upper surface of the piezoelectric body, the reinforcement electrode being electrically connected to the lower connection wiring via the hole electrode. In one example, the hole electrode extends through the upper connection wiring and the lower connection wiring, a first diameter of the hole electrode in the upper connection wiring being larger than a second diameter of the hole electrode in the lower connection wiring.

The material of the lower connection wiring may be different from the material of the upper connection wiring. In particular, an oxygen affinity of the material of the lower connection wiring may be less than an oxygen affinity of the material of the upper connection wiring.

The reinforcement electrode may be in contact with and electrically connected to an upper surface of the lower connection wiring. In one example, the upper connection wiring is divided by the reinforcement electrode in a cross section taken in a direction perpendicular to the upper surface of the piezoelectric body to provide first and second upper connection wirings, the first and second upper connection wirings being electrically connected to each other via the reinforcement electrode. The elastic wave element may further comprise a third connection electrode disposed on the piezoelectric body between the first and second upper connection wirings, the third connection wiring being covered with an insulation layer, and the reinforcement electrode extending over the insulation layer. In another example, the lower connection wiring is divided by the reinforcement electrode in a cross section taken in the direction perpendicular to the upper surface of the piezoelectric body to provide first and second lower connection wirings, the first and second lower connection wirings being electrically connected to each other via the reinforcement electrode. The elastic wave element may further comprise a third connection wiring disposed on the piezoelectric body between the first and second lower connection wirings, the third connection wiring being covered with an insulation layer, and the reinforcement electrode extending over the insulation layer.

In one example, the IDT electrode includes a lower IDT electrode and an upper IDT electrode provided above the lower IDT electrode, a material of the lower IDT electrode being identical to a material of the lower connection wiring, and a material of the upper IDT electrode being identical to a material of the upper connection wiring.

According to another embodiment, an elastic wave element comprises a piezoelectric body having an upper surface, a first interdigital transducer (IDT) electrode disposed on the piezoelectric body, a second IDT electrode disposed on the piezoelectric body, a connection wiring disposed on the upper surface of the piezoelectric body and electrically connected to the first IDT electrode and the second IDT electrode, the connection wiring including a lower connection wiring and a upper connection wiring disposed above the lower connection wiring, and a reinforcement electrode disposed above the connection wiring, the reinforcement electrode being in contact with and electrically connected to the lower connection wiring.

In one example, the lower connection wiring is formed of a first material and the upper connection wiring is formed of a second material, an oxygen affinity of the first material being less than an oxygen affinity of the second material.

In another example, the reinforcement electrode is further in contact with and electrically connected to the upper connection wiring. The connection wiring may further include a hole electrode extending through the upper connection wiring and the lower connection wiring in a direction perpendicular to the upper surface of the piezoelectric body. In one example, the hole electrode has a first diameter in the upper connection wiring and a second diameter in the lower connection wiring, the first diameter being larger than the second diameter. The reinforcement electrode is electrically connected to the lower connection wiring via the hole electrode.

In another example, the connection wiring, including both the upper and lower connection wirings, is divided by the reinforcement electrode in a cross section taken in a direction perpendicular to the upper surface of the piezoelectric body to provide first and second connection wirings, the first and second connection wirings being electrically connected to each other via the reinforcement electrode. The elastic wave element may further comprise a third connection wiring disposed on the piezoelectric body between the first and second connection wirings, the third connection wiring being covered with an insulation layer, and the reinforcement electrode extending over the insulation layer.

Another embodiment is directed to a ladder filter including the elastic wave element of any of the examples discussed above.

According to another embodiment, an elastic wave element comprises a piezoelectric body having an upper surface, a first interdigital transducer (IDT) electrode disposed on the piezoelectric body, a second IDT electrode disposed on the piezoelectric body, a connection wiring disposed on the upper surface of the piezoelectric body and electrically connected to the first IDT electrode and the second IDT electrode, and means for reducing electric loss in the connection wiring.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Certain aspects and embodiments are described below with reference to the drawings and an exemplary elastic wave element 60.

Figure 3:
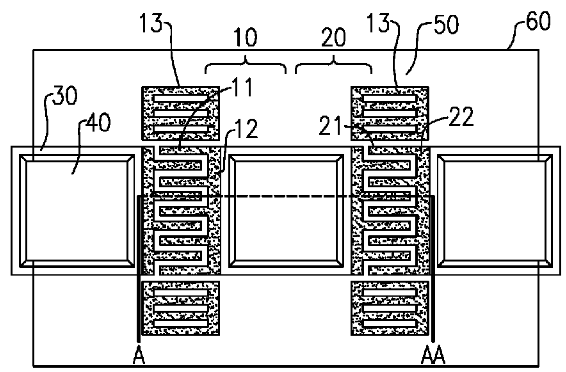
FIG. 3 is a plan view schematically showing one example of an elastic wave element according to aspects of the present invention.

FIG. 3 is a plan view schematically illustrating an embodiment of the elastic wave element 60. FIGS. 4A-D are cross-sectional views of various examples of the elastic wave element 60 taken along line A-AA in FIG. 3.

According to one embodiment, the elastic wave element 60 includes a piezoelectric body 50 made of a single crystal piezoelectric material. A first IDT electrode 10 and a second IDT electrode 20 are provided on the upper surface of the piezoelectric body 50. The elastic wave element 60 further includes two reflectors 13 disposed adjacent the IDT electrodes 10, 20 in the propagation direction of an elastic wave generated by the first IDT electrode 10 and the second IDT electrode 20. The elastic wave element 60 further includes a connection wiring 30 electrically connecting the first IDT electrode 10 and the second IDT electrode 20, and a reinforcement electrode 40 provided on the upper surface of the connection wiring 30 for reducing the electric loss of the connection wiring 30. The first IDT electrode 10 has comb-shaped electrodes each including a line-shaped first bus bar 12 and a plurality of first electrode fingers 11 perpendicularly extending with respect to the line direction of the line-shaped first bus bar 12. The first IDT electrode 10 is made of the opposing comb-shaped electrodes. Similar to the first IDT electrode 10, the second IDT electrode 20 includes comb-shaped electrodes each having a second bus bar 22 and a plurality of second electrode fingers 21. The first IDT electrode 10, the second IDT electrode 20, the reflectors 13, the connection wiring 30, and the reinforcement electrode 40 may be formed by patterning a metallic thin film. Although not shown in the drawings, those skilled in the art will appreciate, given the benefit of this disclosure, that the elastic wave element 60 according to certain embodiments may be improved in its temperature characteristic by providing a dielectric layer that covers the upper surfaces of the piezoelectric body 50, the first IDT electrode 10, the second IDT electrode 20, the reflectors 13, the connection wiring 30, and the reinforcement electrode 40.

In one embodiment, the connection wiring 30 includes an upper connection wiring 31 and a lower connection wiring 32. The lower connection wiring 32 and the reinforcement electrode 40 are in contact with and electrically connected to each other so that the electric loss can be greatly reduced in the connection wiring 30. The electric loss may occur when an oxide film formed on the surface of the upper connection wiring 31 and the lower connection wiring 32 during the thin film processing blocks the electrical connection between the connection wiring 30 and the reinforcement electrode 40. In other words, the electrical resistance reduction effect of the connection wiring 30, which is effected by providing the reinforcement electrode 40 as described above, may be lost or degraded by the presence of the oxide film. In view of the reasons as described above, certain aspects and embodiments address the oxide film formed on the surface of the connection wiring 30 and reduce the electric loss in the connection wiring 30 by reducing the contact resistance between the connection wiring 30 and the reinforcement electrode 40.

According to one embodiment, the material forming the upper connection wiring 31 and the lower connection wiring 32 may preferably be a material that is not likely to form an oxide film on the surface. Generally, the susceptibility to oxidation is represented by an oxygen affinity. In addition, because the main cause of the electric loss reduction effect in the connection wiring 30 in one embodiment is the configuration in which the lower connection wiring 32 and the reinforcement electrode 40 are in contact with and electrically connected to each other, it may be preferable to allow the oxygen affinity of the material forming the lower connection wiring 32 to be less than the oxygen affinity of the material forming the upper connection wiring 31. The oxygen affinity of the material generally correlates with a standard free-energy, and the less the standard free-energy ($\Delta G/kJmol^{-1}$), the less the oxygen affinity. Representative materials are exemplified by: $Pt<Ru<Cu<Mo\approx W\ll Ti<Al<Mg$ listed in ascending order of the standard free-energy.

It is to be appreciated that although a two-layer structure of upper connection wiring 31 and the lower connection wiring 32 is described in at least one embodiment, the structure is not limited to two layers and may be configured as three or more layers.

The configuration of the connection wiring 30 and the reinforcement electrode 40 according to certain embodiments is described in detail below with reference to FIGS. 4A-D.

As shown in FIGS. 4A-D, according to certain embodiments, at least the lower connection wiring 32 and the reinforcement electrode 40 are in contact with and electrically connected to each other in the connection wiring 30. The lower connection wiring 32, the upper connection wiring 31, and the reinforcement electrode 40 are sequentially provided on the upper surface of the piezoelectric body 50. In addition, the connection wiring 30 can be integrally and simultaneously formed with the first IDT electrode 10 and the second IDT electrode 20 using thin film processing. Furthermore, it may be preferable to use the same configuration (e.g., a vertically two-layer structure) and the same material for simplifying the manufacturing process.

Figure 4A:
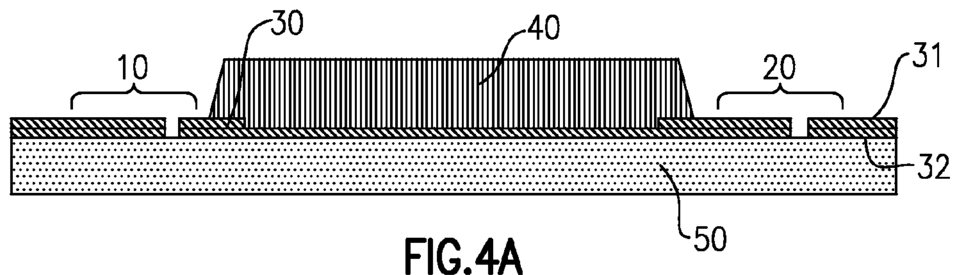
FIGS. 4A-D are cross-sectional views of examples of the elastic wave element of FIG. 3 taken along line A-AA in FIG. 3.

Referring to FIG. 4A, in one embodiment, it is characteristic that the upper connection wiring 31 is divided by the reinforcement electrode 40, and the upper surface of the lower connection wiring 32 and the reinforcement electrode 40 are in contact with and electrically connected to each other. In addition, the upper surface and the side surfaces of the upper connection wiring 31 are in contact with and electrically connected to the reinforcement electrode 40.

Figure 4B:
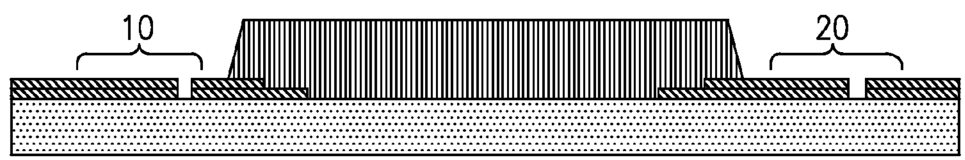

Referring to FIG. 4B, in another embodiment, in addition to the characteristics of the example shown in FIG. 4A, the lower connection wiring 32 is also divided by the reinforcement electrode 40, and the piezoelectric body 50 also has a surface in contact with the reinforcement electrode 40. The reinforcement electrode 40 may be characterized by the configuration of being in contact with and electrically connected to the side surfaces of the lower connection wiring 32.

Figure 4C:
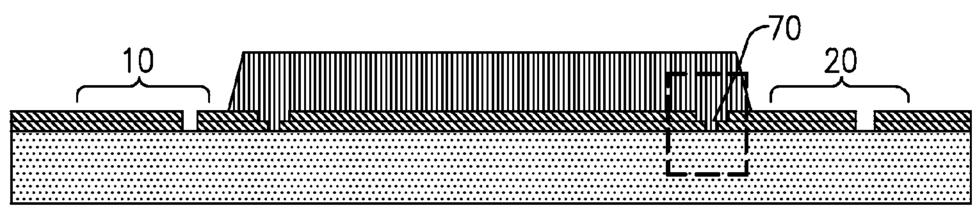

Referring to FIG. 4C, according to another embodiment, a hole electrode 70 is provided extending in the direction perpendicular to the upper surface of the piezoelectric body 50 through the upper connection wiring 31 and the lower connection wiring 32, such that the lower connection wiring 32 and the reinforcement electrode 40 are in contact with and electrically connected to each other. In addition, with respect to the cross section of the hole electrode 70 taken along the direction parallel to the upper surface of the piezoelectric body 50, it may be preferable to allow the cross-sectional area of the hole electrode 70 provided in the lower connection wiring 32 to be less than the cross-sectional area of the hole electrode 70 provided in the upper connection wiring 31, such that not only the side surfaces of the lower connection wiring 32 but also the upper surface thereof can be in contact with and electrically connected to the reinforcement electrode 40. As a result, the contact area is greater to further reduce the contact resistance.

It is to be appreciated that the shape of the hole electrode 70 is not limited to the example shown in FIG. 4C, and may have any cross-sectional shape, including, for example, circular, rectangular, and the like. In addition, the cross section may be differently configured in the depth direction of the hole electrode 70. It is also to be appreciated that, although not shown in the drawings, the hole electrode 70 may be provided only in the upper connection wiring 31 for the upper surface of the lower connection wiring 32 to be in contact with and electrically connected to the hole electrode 70.

Figure 4D:
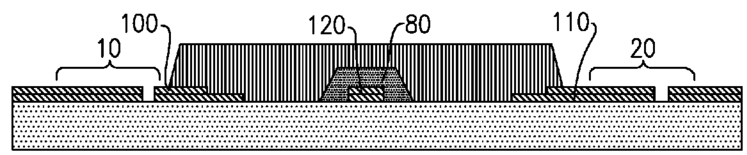

Referring to FIG. 4D, there is illustrated another configuration of the connection wiring according to certain examples. In this configuration, when one connection wiring 30 divided by the reinforcement electrode 40 is designated as a first connection wiring 100 and the other connection wiring 30 is designated as a second connection wiring 110, a third connection wiring 120 is provided on the upper surface of the piezoelectric body 50 between the first connection wiring 100 and the second connection wiring 110. The third connection wiring 120 is covered with an insulation layer 80. As a characteristic configuration, the reinforcement electrode 40 may cross with an overpass of the third connection wiring 120 via the insulation layer 80, and the first connection wiring 100 and the second connection wiring 110 are in contact with and electrically connected to each other. The third connection wiring 120 may be an electrode that has a potential different from that of the first connection wiring 100 or the second connection wiring 110. In one example, the third connection wiring 120 may be integrally and simultaneously formed with the first connection wiring 100 and the second connection wiring 110. It may be preferable to adopt the same configuration (e.g., a vertically two-layer structure) and the same material for simplifying the manufacturing process.

The contact resistance between the connection wiring 30 and the reinforcement electrode 40 will be described below, comparing embodiments of elastic wave element 60 with a conventional elastic wave element, and with reference to FIGS. 5A-7B, which illustrate examples of measuring the contact resistances in the connection wiring 30 and the reinforcement electrode 40.

Figure 1:
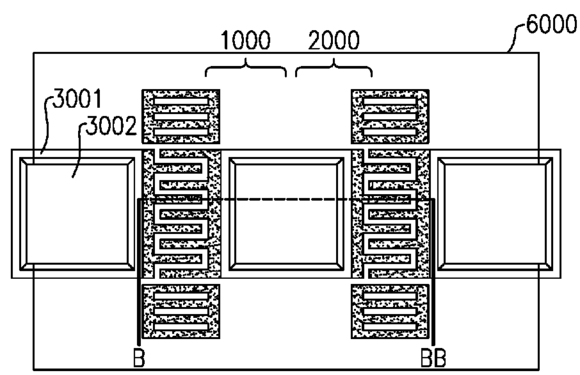
FIG. 1 is a plan view schematically showing an example of a conventional elastic wave element.
Figure 2:
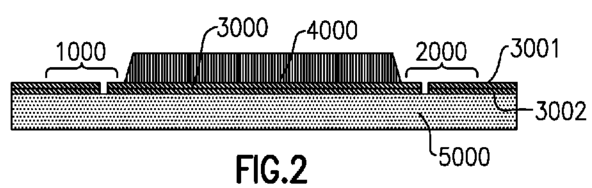
FIG. 2 is a cross-sectional view of the conventional elastic wave element of FIG. 1 taken along line B-BB in FIG. 1.
Figure 5A:
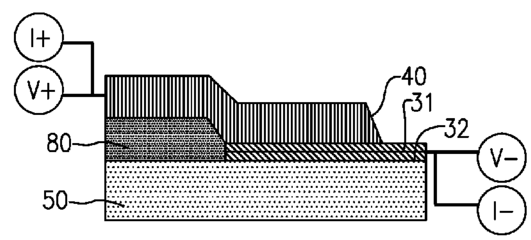
FIG. 5A is a cross-sectional view of one example of a conventional elastic wave element showing measurement conditions of a contact resistance value of the connection wiring.
Figure 5B:
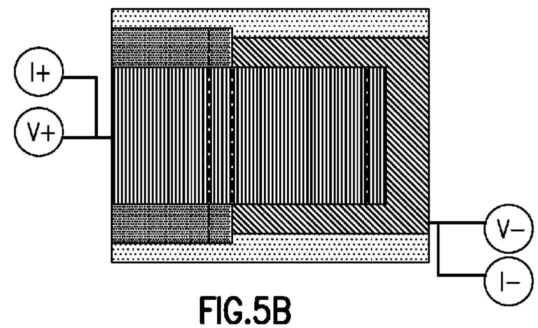
FIG. 5B is a corresponding plan view of the example conventional elastic wave element of FIG. 5A.

FIG. 5A is a cross-sectional view and FIG. 5B is a plan view corresponding to the configuration of the conventional elastic wave element of FIG. 2. FIGS. 5A and 5B illustrate a comparative example in which the reinforcement electrode 40 is only in contact with and electrically connected to the upper connection wiring 31.

Figure 6A:
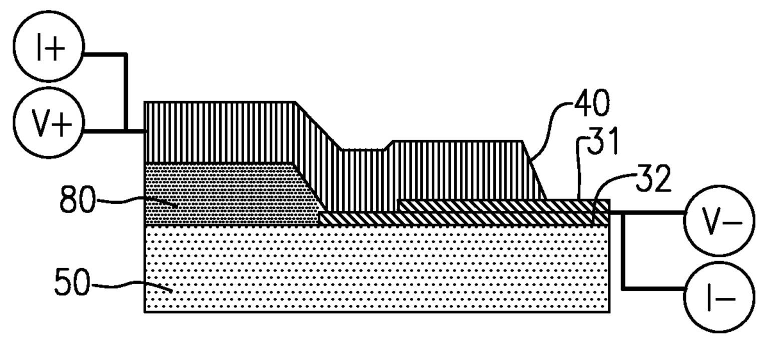
FIG. 6A is a cross-sectional view of one example of an elastic wave element showing measurement conditions of a contact resistance value of the connection wiring according to aspects of the present invention.
Figure 6B:
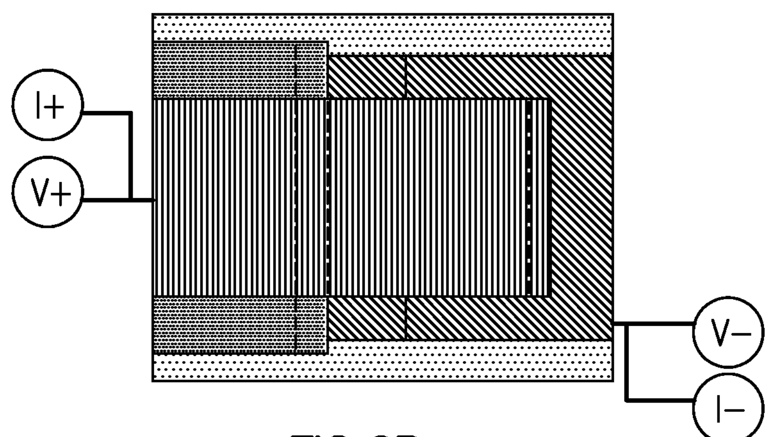
FIG. 6B is a corresponding plan view of the example elastic wave element of FIG. 6A.

FIGS. 6A and 6B illustrate a cross-sectional view and corresponding plan view, respectively, of one example of an embodiment of the elastic wave element 60 in which the upper connection wiring 31 and the lower connection wiring 32 are in contact with and electrically connected to each other.

Figure 7A:
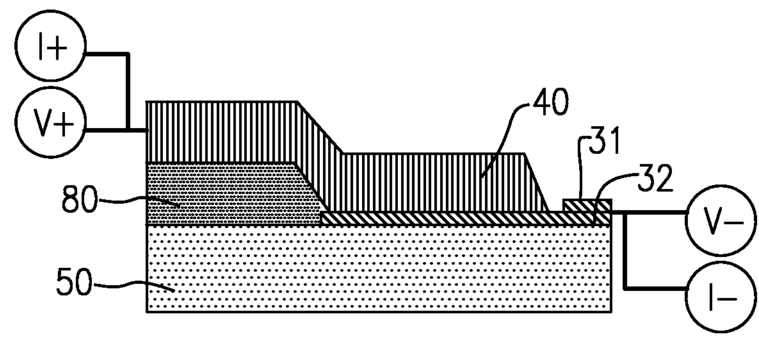
FIG. 7A is a cross-sectional view of another example of an elastic wave element showing measurement conditions of a contact resistance value of the connection wiring according to aspects of the present invention.
Figure 7B:
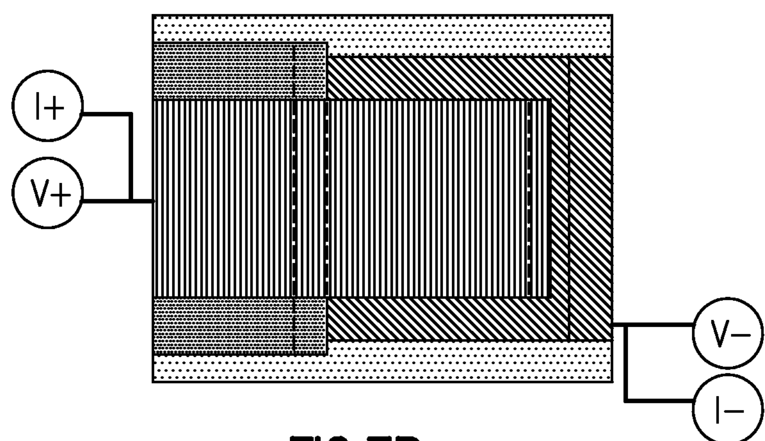
FIG. 7B is a corresponding plan view of the example elastic wave element of FIG. 7A.

FIGS. 7A and 7B illustrate a cross-sectional view and corresponding plan view, respectively, of another example of an embodiment of the elastic wave element 60 in which only the lower connection wiring 32 is in contact with and electrically connected to the reinforcement electrode 40.

For each of these examples, the reinforcement electrode 40 is made of Aluminum (Al), the upper connection wiring 31 is made of an Aluminum alloy, the lower connection wiring 32 is made of Molybdenum (Mo), and the total contact area between the reinforcement electrode 40 and the connection wiring 30 is 400 $\mu m^2$.

Figure 8:
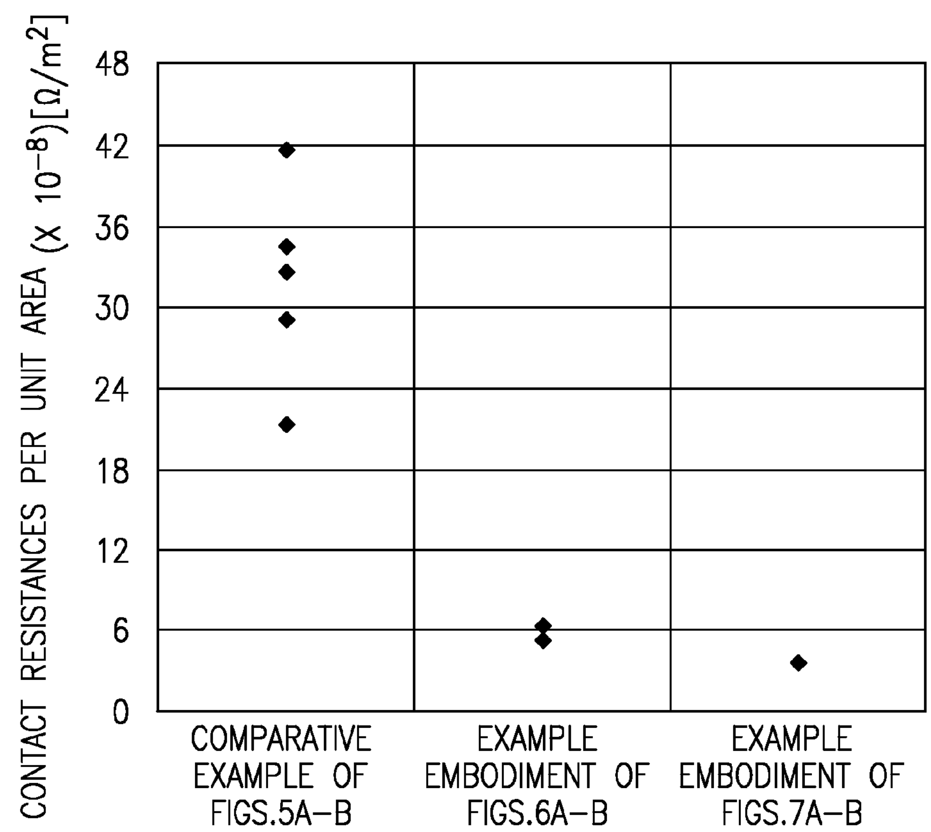
FIG. 8 is a characteristic diagram showing measurement results of the contact resistance value of the connection wiring corresponding to the examples of FIGS. 5A-7B.

FIG. 8 shows the measurement results of the contact resistance per unit area between the connection wiring 30 and the reinforcement electrode 40. Five measurement points are plotted per each of FIGS. 5A-7B in FIG. 8. As shown in FIG. 8, the contact resistances per unit area of the embodiments of FIGS. 6A-B and 7A-B are lower than the contact resistances per unit area of the comparative example of FIGS. 5A-B. This is because the oxide film formed on the upper surface of the upper connection wiring 31 during the thin film processing increases the contact resistances per unit area between the reinforcement electrode 40 and the connection wiring 30. In addition, the contact resistances per unit area of the embodiment of FIGS. 7A-B are lower than the contact resistances per unit area of the embodiments of FIGS. 5A-B and 6A-B. This is because the oxygen affinity of the lower connection wiring 32 (Mo) is less than the upper connection wiring 31 (Al alloy), such that the oxide film is less likely to be formed. Furthermore, comparing the measurement values of the contact resistances per unit area shows that the measurement values for the embodiments of FIGS. 6A-B and 7A-B are less variable and more stable than the comparative example of FIGS. 5A-B. Still furthermore, the variation in measurement values of contact resistances of the embodiment of FIGS. 7A-B is less than that of the embodiment of FIGS. 6A-B. This shows that the greater the contact area between the upper connection wiring 31 on which the oxide film is likely to be formed and the reinforcement electrode 40, the more variable are the measurement values of the contact resistances. Therefore, configuring the connection wiring 30 according to certain embodiments such that at least the lower connection wiring 32 is in contact with and electrically connected to the reinforcement electrode 40 reduces the contact resistance between the connection wiring 30 and the reinforcement electrode 40. As a result, the electric loss in the connection wiring 30 can be reduced.

Examples of the resistance values per unit length of the connection wiring 30 will be described below, comparing another embodiment of the elastic wave element 60 with a conventional elastic wave element, and with reference to FIGS. 9A-11B, which illustrate examples of measuring the resistance values per unit length of the connection wiring 30. The connection wiring configuration and the structure material of each configuration are similar to the configuration described above and illustrated in FIG. 4. The lower connection wiring 32 is provided on the upper surface of piezoelectric body 50, and the reinforcement electrode 40 is subsequently provided on the upper surface of lower connection wiring 32.

Figure 9A:
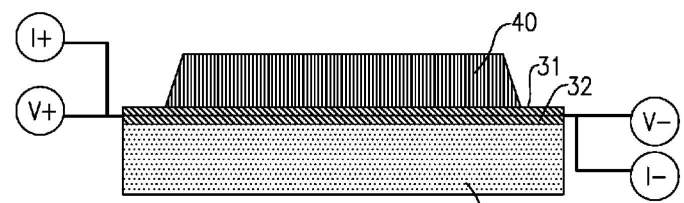
FIG. 9A is a cross-sectional view of an example of a conventional elastic wave element showing measurement conditions of a resistance value per unit length of the connection wiring.
Figure 9B:
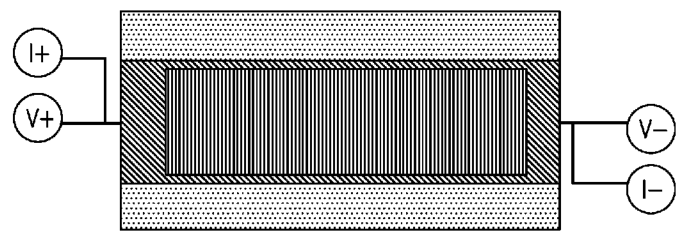
FIG. 9B is a corresponding plan view of the example conventional elastic wave element of FIG. 9A.
Figure 10A:
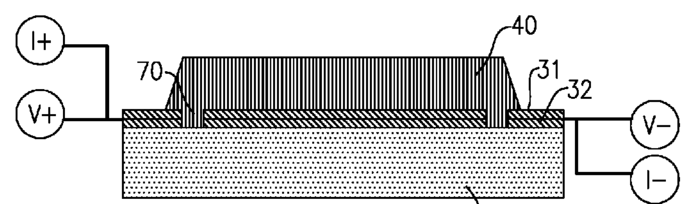
FIG. 10A is a cross-sectional view of one example of an elastic wave element showing measurement conditions of a resistance value per unit length of the connection wiring, according to aspects of the present invention.
Figure 10B:
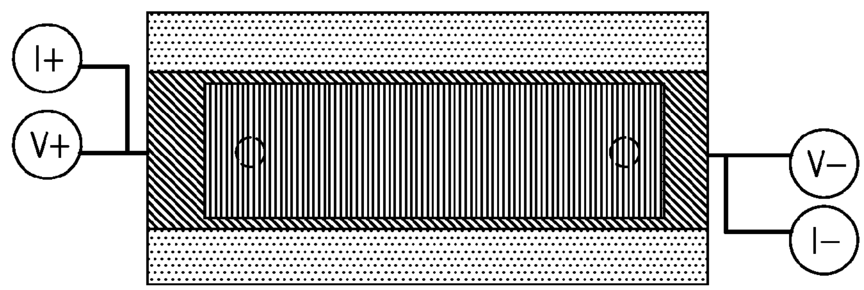
FIG. 10B is a corresponding plan view of the example elastic wave element of FIG. 10A.

FIGS. 9A and 9B illustrate a cross-sectional view and corresponding plan view, respectively, of a comparative example in which there is no contact between the reinforcement electrode 40 and the lower connection wiring 32. The cross-sectional view of FIG. 10A and the corresponding plan view of FIG. 10B show an example embodiment in which the hole electrode 70 has a diameter of 8 μm and extends through the upper connection wiring 31 and the lower connection wiring 32. The hole electrode 70 is filled with the reinforcement electrode 40, with the reinforcement electrode 40 and the side surfaces of the lower connection wiring 32 being electrically connected to each other via the hole electrode 70.

Figure 12:
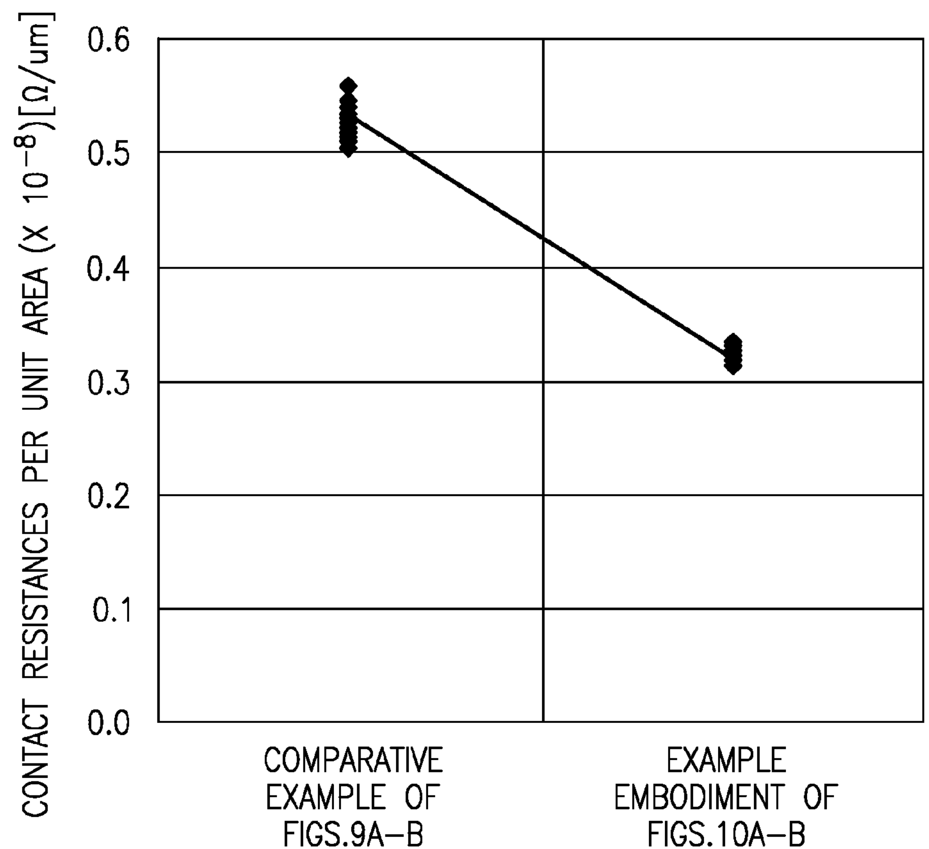
FIG. 12 is a characteristic diagram showing measurement results of the resistance value of the connection wiring corresponding to the examples of FIGS. 9A-11B.

FIG. 12 shows measurement results of the resistance values per unit length of the connection wiring 30. As shown in FIG. 12, the resistance values per unit length in the connection wiring 30 of the example embodiment illustrated in FIGS. 10A-B are lower than the resistance values per unit length in the connection wiring 30 of the comparative example illustrated in FIGS. 9A-B. The lower connection wiring 32 and the reinforcement electrode 40 may be in contact with and electrically connected to each other even by a small area, and the result is that the electric loss may be reduced in the connection wiring 30.

Figure 11A:
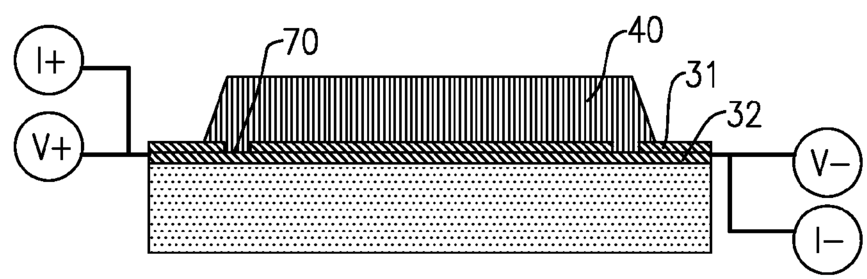
FIG. 11A is a cross-sectional view of another example of an elastic wave element showing measurement conditions of a resistance value per unit length of the connection wiring, according to aspects of the present invention.
Figure 11B:
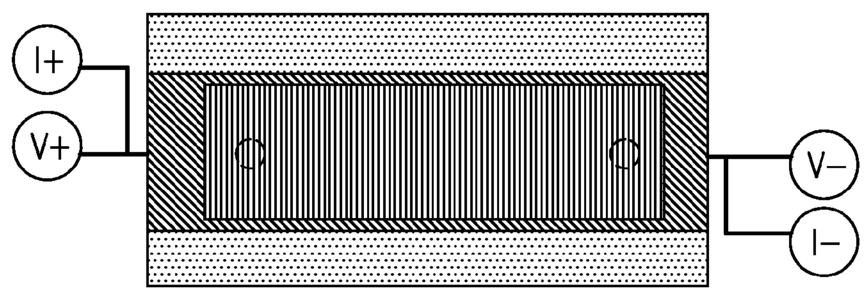
FIG. 11B is a corresponding plan view of the example elastic wave element of FIG. 11A.

FIGS. 11A and 11B illustrate cross-section and plan views, respectively, of another configuration in which the hole electrode 70 is filled with the reinforcement electrode 40 and is provided only in the upper connection wiring 31 for the reinforcement electrode 40 to be in contact with and electrically connected to the upper surface of the lower connection wiring 32. This configuration may also reduce the resistance value per unit length of the connection wiring 30 with respect to the comparative example of FIGS. 9A-B, and may also achieve the reduction effect of the electric loss in the connection wiring 30.

It is to be appreciated that the diameter of the hole electrode 70 is not limited to the example of 8 μm discussed above, and that the effect of the reducing electric loss may be achieved by the lower connection wiring 32 and the reinforcement electrode 40 being in contact with and electrically connected to each other.

The pass characteristics of a ladder filter using an embodiment of the elastic wave element 60 and a ladder filter using the conventional elastic wave element 6000 are described below.

Figure 13:
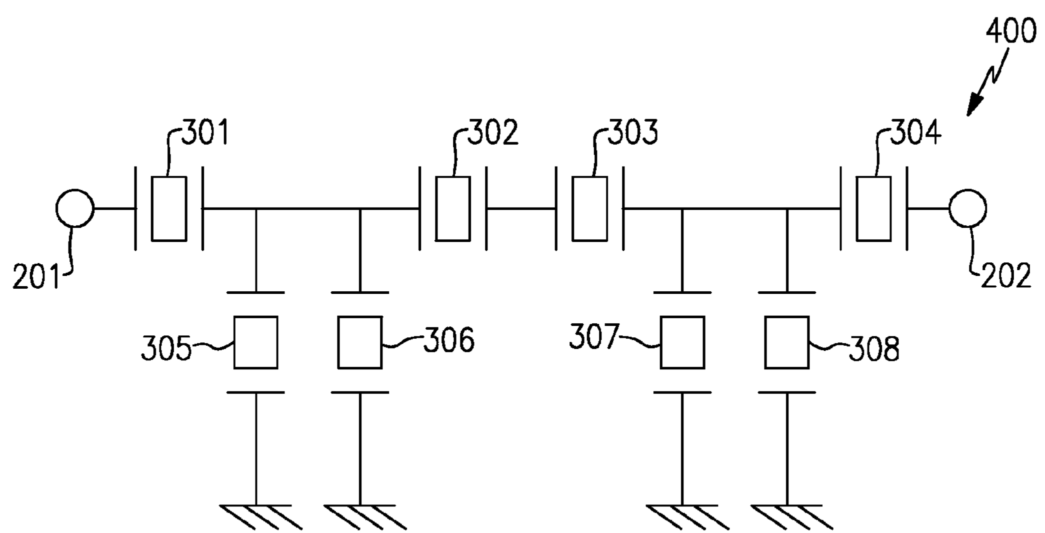
FIG. 13 is a circuit diagram of one example of a ladder filter according to aspects of the present invention.

FIG. 13 is a circuit diagram of one example of a ladder filter 400 using an embodiment of the elastic wave element 60. As shown in FIG. 13, the ladder filter 400 according to one embodiment includes a first serial resonator 301, a second serial resonator 302, a third serial resonator 303, and a fourth serial resonator 304 serially connected between an input terminal 201 and an output terminal 202. A first parallel resonator 305 and a second parallel resonator 306 are connected at one end between the first serial resonator 301 and the second serial resonator 302 and connected at the other end to the ground. A third parallel resonator 307 and a fourth parallel resonator 308 are connected at one end between the third serial resonator 303 and the fourth serial resonator 304 and connected at the other end to the ground. Each of the resonators 301, 302, 303, 304, 305, 306, 307, and 308 may include the elastic wave element 60.

According to one embodiment, both ends of each of the IDT electrodes of the resonators of the ladder filter 400 are provided at a single portion with the hole electrode 70, as shown in FIG. 10B, whereas the comparative example is manufactured having no hole electrode 70. The pass characteristics for each ladder filter are compared in FIG. 14.

Figure 14:
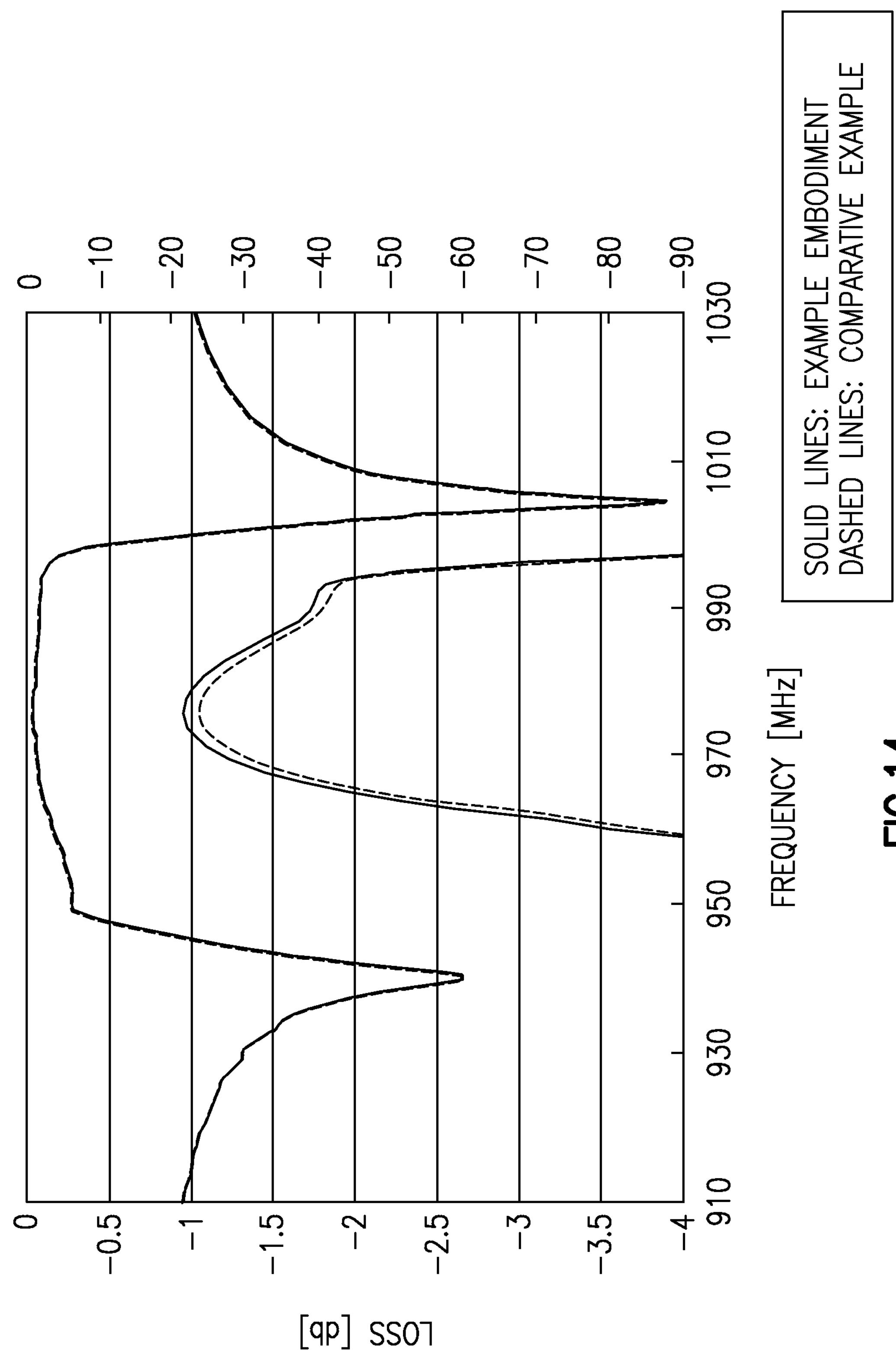
FIG. 14 is a characteristic diagram showing pass characteristics of the ladder filter according to aspects of the present invention.

FIG. 14 shows measurement results of the pass characteristics in the ladder filter 400. As shown in FIG. 14, the ladder filter of the example embodiment may enhance the attenuation amount in the passband and may reduce the minimum insertion loss in the passband with respect to that of the comparative example.

Embodiments of the elastic wave element discussed herein are useful in configurations of a ladder filter and/or in various electronic devices, such as a cell phone.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, embodiments of the methods and apparatuses discussed herein are not limited in application to the details of construction and the arrangement of components set forth in the preceding description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. It is further to be appreciated that the terms indicating the perpendicular direction, the parallel direction, the depth direction and the like are used for descriptive purposes to explain aspects of the present invention. Therefore, these terms do not designate the absolute directions and are not intended to be limiting. The foregoing description and drawings are by way of example only, and the scope of the invention should be determined from proper construction of the appended claims, and their equivalents.

What is claimed is:

1. An elastic wave element comprising:

a piezoelectric body having an upper surface;

an interdigital transducer (IDT) electrode disposed on the piezoelectric body;

a connection wiring disposed on the piezoelectric body and electrically connected to the IDT electrode, the connection wiring including a lower connection wiring, an upper connection wiring disposed above the lower connection wiring, and a hole electrode extending through the upper connection wiring and the lower connection wiring in a direction perpendicular to the upper surface of the piezoelectric body, a first diameter of the hole electrode in the upper connection wiring being larger than a second diameter of the hole electrode in the lower connection wiring; and a reinforcement electrode disposed above the connection wiring, the reinforcement electrode being in contact with and electrically connected to the lower connection wiring via the hole electrode.

2. The elastic wave element of claim 1 wherein the IDT electrode includes a lower IDT electrode and an upper IDT electrode provided above the lower IDT electrode, a material of the lower IDT electrode being identical to a material of the lower connection wiring, and a material of the upper IDT electrode being identical to a material of the upper connection wiring.

3. A ladder filter including the elastic wave element of claim 1.

4. The elastic wave element of claim 1 wherein a material of the lower connection wiring is different from a material of the upper connection wiring.

5. The elastic wave element of claim 4 wherein an oxygen affinity of the material of the lower connection wiring is less than an oxygen affinity of the material of the upper connection wiring.

6. The elastic wave element of claim 1 wherein the reinforcement electrode is in contact with and electrically connected to an upper surface of the lower connection wiring.

7. The elastic wave element of claim 6 wherein the upper connection wiring is divided by the reinforcement electrode in a cross section taken in the direction perpendicular to the upper surface of the piezoelectric body to provide first and second upper connection wirings, the first and second upper connection wirings being electrically connected to each other via the reinforcement electrode.

8. The elastic wave element of claim 7 wherein the lower connection wiring is divided by the reinforcement electrode in a cross section taken in the direction perpendicular to the upper surface of the piezoelectric body to provide first and second lower connection wirings, the first and second lower connection wirings being electrically connected to each other via the reinforcement electrode.

9. The elastic wave element of claim 6 wherein the connection wiring, including both the upper and lower connection wirings, is divided by the reinforcement electrode in a cross section taken in the direction perpendicular to the upper surface of the piezoelectric body to provide first and second connection wirings, the first and second connection wirings being electrically connected to each other via the reinforcement electrode.

10. The elastic wave element of claim 9 further comprising a third connection wiring disposed on the piezoelectric body between the first and second connection wirings, the third connection wiring being covered with an insulation layer, and the reinforcement electrode extending over the insulation layer.

11. An elastic wave element comprising:

a piezoelectric body having an upper surface;

a first interdigital transducer (IDT) electrode disposed on the piezoelectric body;

a second IDT electrode disposed on the piezoelectric body;

a connection wiring disposed on the upper surface of the piezoelectric body and electrically connected to the first IDT electrode and the second IDT electrode, the connection wiring including a lower connection wiring, an upper connection wiring disposed above the lower connection wiring, and a hole electrode extending through the upper connection wiring and the lower connection wiring in a direction perpendicular to the upper surface of the piezoelectric body, the hole electrode having a first diameter in the upper connection wiring and a second diameter in the lower connection wiring, the first diameter being larger than the second diameter; and a reinforcement electrode disposed above the connection wiring, the reinforcement electrode being in contact with and electrically connected to the upper connection wiring and being in contact with and electrically connected to the lower connection wiring via the hole electrode.

12. The elastic wave element of claim 11 wherein the lower connection wiring is formed of a first material and the upper connection wiring is formed of a second material, an oxygen affinity of the first material being less than an oxygen affinity of the second material.

13. The elastic wave element of claim 11 wherein the connection wiring, including both the upper and lower connection wirings, is divided by the reinforcement electrode in a cross section taken in the direction perpendicular to the upper surface of the piezoelectric body to provide first and second connection wirings, the first and second connection wirings being electrically connected to each other via the reinforcement electrode.

14. The elastic wave element of claim 13 further comprising a third connection wiring disposed on the piezoelectric body between the first and second connection wirings, the third connection wiring being covered with an insulation layer, and the reinforcement electrode extending over the insulation layer.

15. A ladder filter including the elastic wave element of claim 11.

16. An elastic wave element comprising:

a piezoelectric body having an upper surface;

an interdigital transducer (IDT) electrode disposed on the piezoelectric body;

a connection wiring disposed on the piezoelectric body and electrically connected to the IDT electrode, the connection wiring including a lower connection wiring and an upper connection wiring disposed above the lower connection wiring; and a reinforcement electrode disposed above the connection wiring, the reinforcement electrode being in contact with and electrically connected to an upper surface of the lower connection wiring, and the upper connection wiring being divided by the reinforcement electrode in a cross section taken in a direction perpendicular to the upper surface of the piezoelectric body to provide first and second upper connection wirings, the first and second upper connection wirings being electrically connected to each other via the reinforcement electrode.

17. The elastic wave element of claim 16 wherein the lower connection wiring is divided by the reinforcement electrode in a cross section taken in the direction perpendicular to the upper surface of the piezoelectric body to provide first and second lower connection wirings, the first and second lower connection wirings being electrically connected to each other via the reinforcement electrode.

18. The elastic wave element of claim 17 further comprising an additional connection wiring disposed on the piezoelectric body between the first and second lower connection wirings and between the first and second upper connection wirings, the additional connection wiring being covered with an insulation layer, and the reinforcement electrode extending over the insulation layer.

19. The elastic wave element of claim 16 wherein the connection wiring includes a hole electrode extending in a direction perpendicular to the upper surface of the piezoelectric body, the reinforcement electrode being electrically connected to the lower connection wiring via the hole electrode.

20. The elastic wave element of claim 19 wherein the hole electrode extends through the upper connection wiring and the lower connection wiring, a first diameter of the hole electrode in the upper connection wiring being larger than a second diameter of the hole electrode in the lower connection wiring.

* * * * *